United States Patent
Yoon et al.

(10) Patent No.: US 8,134,856 B2
(45) Date of Patent: Mar. 13, 2012

(54) DATA PROTECTION SCHEME DURING POWER-UP IN SPIN TRANSFER TORQUE MAGNETORESISTIVE RANDOM ACCESS MEMORY

(75) Inventors: Sei Seung Yoon, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 190 days.

(21) Appl. No.: 12/265,068

(22) Filed: Nov. 5, 2008

(65) Prior Publication Data

US 2010/0110776 A1 May 6, 2010

(51) Int. Cl.
*G11C 11/00* (2006.01)
*G11C 11/14* (2006.01)
*G11C 11/15* (2006.01)
*G11C 7/00* (2006.01)
*G11C 5/14* (2006.01)

(52) U.S. Cl. ........ 365/148; 365/158; 365/171; 365/173; 365/203; 365/226

(58) Field of Classification Search .................. 365/148, 365/158, 171, 173, 185.04, 226, 227, 200, 365/203, 163, 175, 185.23, 185.25, 230.06; 438/3
See application file for complete search history.

(56) References Cited

U.S. PATENT DOCUMENTS

| | | | | | |
|---|---|---|---|---|---|
| 5,257,239 | A | * | 10/1993 | Guo et al. | 365/226 |
| 5,483,491 | A | * | 1/1996 | Yoshioka et al. | 365/200 |
| 5,576,988 | A | * | 11/1996 | Kuo et al. | 365/185.04 |
| 5,602,797 | A | * | 2/1997 | Kang | 365/230.06 |
| 5,627,788 | A | * | 5/1997 | Chang et al. | 365/227 |
| 7,068,533 | B2 | * | 6/2006 | Ferrant et al. | 365/158 |
| 7,345,912 | B2 | * | 3/2008 | Luo et al. | 365/158 |
| 7,486,547 | B2 | * | 2/2009 | Tsuji | 365/158 |
| 7,663,959 | B2 | * | 2/2010 | Tao et al. | 365/226 |
| 2004/0057277 | A1 | | 3/2004 | Fujita | |
| 2008/0247222 | A1 | | 10/2008 | Jung | |
| 2009/0104718 | A1 | * | 4/2009 | Zhong et al. | |

OTHER PUBLICATIONS

International Search Report—PCT/US2009/063225, International Search Authority—European Patent Office Jan. 8, 2010.
Written Opinion—PCT/ US2009/063225, International Search Authority—European Patent Office Jan. 8, 2010.

* cited by examiner

*Primary Examiner* — Trong Phan

(74) *Attorney, Agent, or Firm* — Michelle Gallardo; Nicholas J. Pauley; Jonathan T. Velasco (57) ABSTRACT

A Spin Transfer Torque Magnetoresistive Random Access Memory (STT-MRAM) array including a plurality of bit cells, a power-up controller, and a first plurality of precharge transistors is disclosed. The plurality of bit cells are each coupled to one of a plurality of bit lines and word lines. The power-up controller is configured to provide a power-up control signal to control the voltage level of at least one of the bit lines or the word lines during power-up. The first plurality of precharge transistors are respectively coupled to at least one of the plurality of bit lines or the plurality of word lines, each precharge transistor being configured to discharge a corresponding bit line or word line to a desired voltage level based on the power-up control signal.

27 Claims, 6 Drawing Sheets

PARALLEL MAGNETIZATION
LOW RESISTANCE
STATE "0"

PRIOR ART

FIG. 1A

ANTIPARALLEL MAGNETIZATION
HIGH RESISTANCE
STATE "1"

PRIOR ART

READ & WRITE

DATA PROTECTION SCHEME DURING POWER-UP IN SPIN TRANSFER TORQUE MAGNETORESISTIVE RANDOM ACCESS MEMORY

FIELD OF DISCLOSURE

Embodiments of the invention are related to random access memory (RAM). More particularly, embodiments of the invention are related to data protection during power-up in Spin Transfer Torque Magnetoresistive Random Access Memory (STT-MRAM).

BACKGROUND

Random access memory (RAM) is a ubiquitous component of modern digital architectures. RAM can be stand alone devices or can be integrated or embedded within devices that use the RAM, such as microprocessors, microcontrollers, application specific integrated circuits (ASICs), system-on-chip (SoC), and other like devices as will be appreciated by those skilled in the art. RAM can be volatile or non-volatile. Volatile RAM loses its stored information whenever power is removed. Non-volatile RAM can maintain its memory contents even when power is removed from the memory. Although non-volatile RAM has advantages in the ability to maintain its contents without having power applied, conventional non-volatile RAM has slower read/write times than volatile RAM.

Figure 1A:
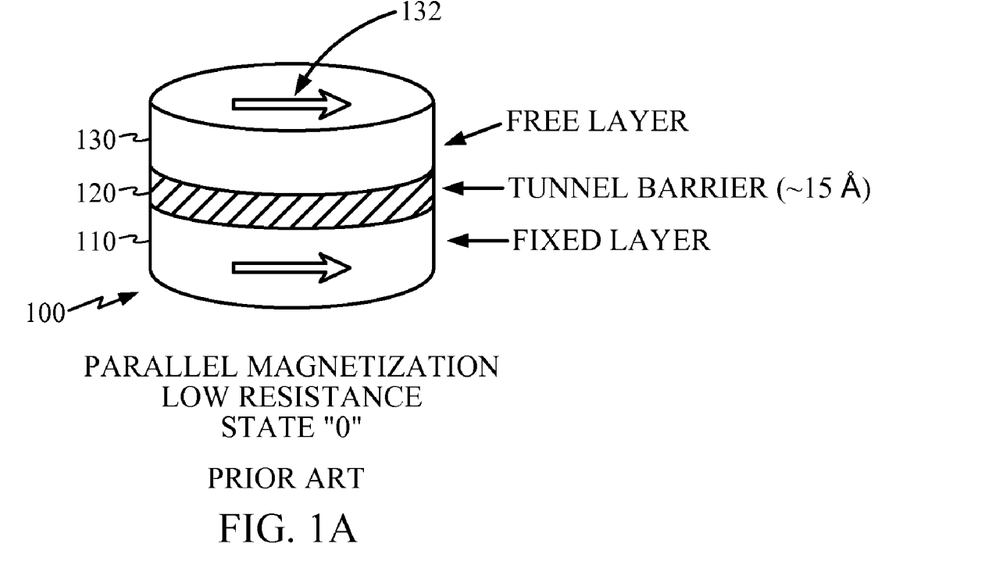
FIGS. 1A and 1B are illustrations of a magnetic tunnel junction (MTJ) storage element.
Figure 1B:
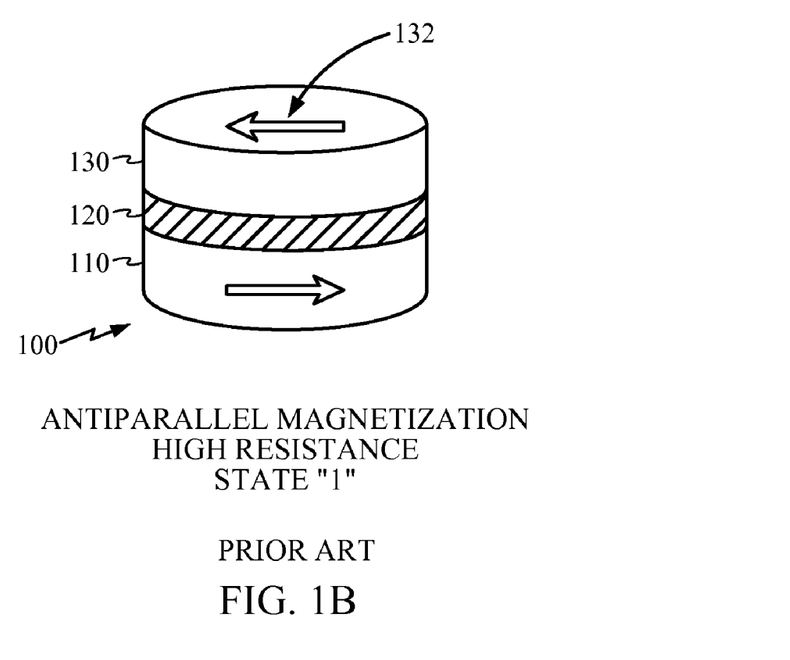

Magnetoresistive Random Access Memory (MRAM) is a non-volatile memory technology that has response (read/write) times comparable to volatile memory. In contrast to conventional RAM technologies which store data as electric charges or current flows, MRAM uses magnetic elements. As illustrated in FIGS. 1A and 1B, a magnetic tunnel junction (MTJ) storage element 100 can be formed from two magnetic layers 110 and 130, each of which can hold a magnetic field, separated by an insulating (tunnel barrier) layer 120. One of the two layers (e.g., fixed layer 110), is set to a particular polarity. The other layer's (e.g., free layer 130) polarity 132 is free to change to match that of an external field that can be applied. A change in the polarity 132 of the free layer 130 will change the resistance of the MTJ storage element 100. For example, when the polarities are aligned, FIG. 1A (PARALLEL MAGNETIZATION LOW RESISTANCE STATE "0"), a low resistance state exists. When the polarities are not aligned, FIG. 1B (ANTIPARALLEL MAGNETIZATION HIGH RESISTANCE STATE "1"), then a high resistance state exists. The illustration of MTJ 100 has been simplified and those skilled in the art will appreciate that each layer illustrated may comprise one or more layers of materials, as is known in the art.

Figure 2A:
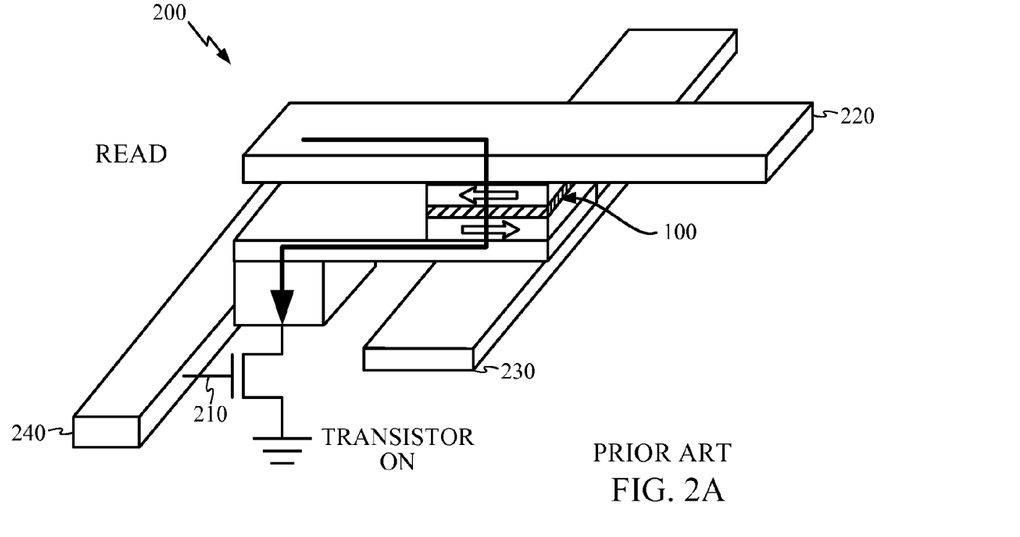
FIGS. 2A and 2B are illustrations of a Magnetoresistive Random Access Memory (MRAM) cell during read and write operations, respectively.

Referring to FIG. 2A, a memory cell 200 of a conventional MRAM is illustrated for a read operation. The cell 200 includes a transistor 210, bit line 220, digit line 230 and word line 240. The cell 200 can be read by measuring the electrical resistance of the MTJ 100. For example, a particular MTJ 100 can be selected by activating an associated transistor 210 (TRANSISTOR ON), which can switch current from a bit line 220 through the MTJ 100. Due to the tunnel magnetoresistive effect, the electrical resistance of the MTJ 100 changes based on the orientation of the polarities in the two magnetic layers (e.g., 110, 130), as discussed above. The resistance inside any particular MTJ 100 can be determined from the current, resulting from the polarity of the free layer. Conventionally, if the fixed layer 110 and free layer 130 have the same polarity, the resistance is low and a "0" is read. If the fixed layer 110 and free layer 130 have opposite polarity, the resistance is higher and a "1" is read.

Figure 2B:
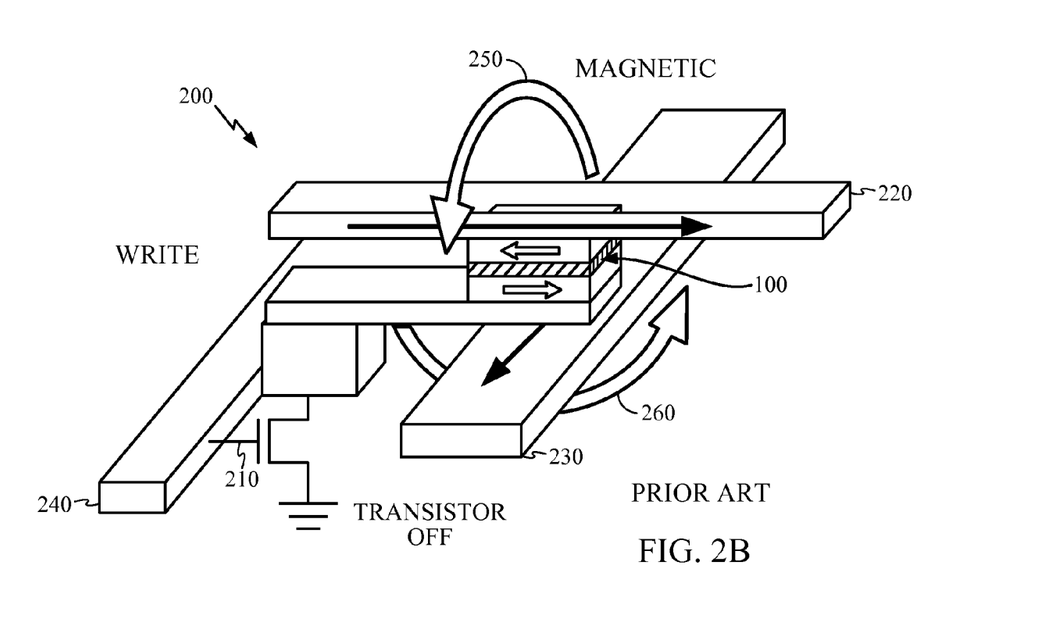

Referring to FIG. 2B, the memory cell 200 of a conventional MRAM is illustrated for a write operation. The write operation of the MRAM is a magnetic operation. Accordingly, transistor 210 is off (TRANSISTOR OFF) during the write operation. Current is propagated through the bit line 220 and digit line 230 to establish magnetic fields 250 and 260 that can affect the polarity of the free layer of the MTJ 100 and consequently the logic state of the cell 200. Accordingly, data can be written to and stored in the MTJ 100.

MRAM has several desirable characteristics that make it a candidate for a universal memory, such as high speed, high density (i.e., small bitcell size), low power consumption, and no degradation over time. However, MRAM has scalability issues. Specifically, as the bit cells become smaller, the magnetic fields used for switching the memory state increase. Accordingly, current density and power consumption increase to provide the higher magnetic fields, thus limiting the scalability of the MRAM.

Figure 3A:
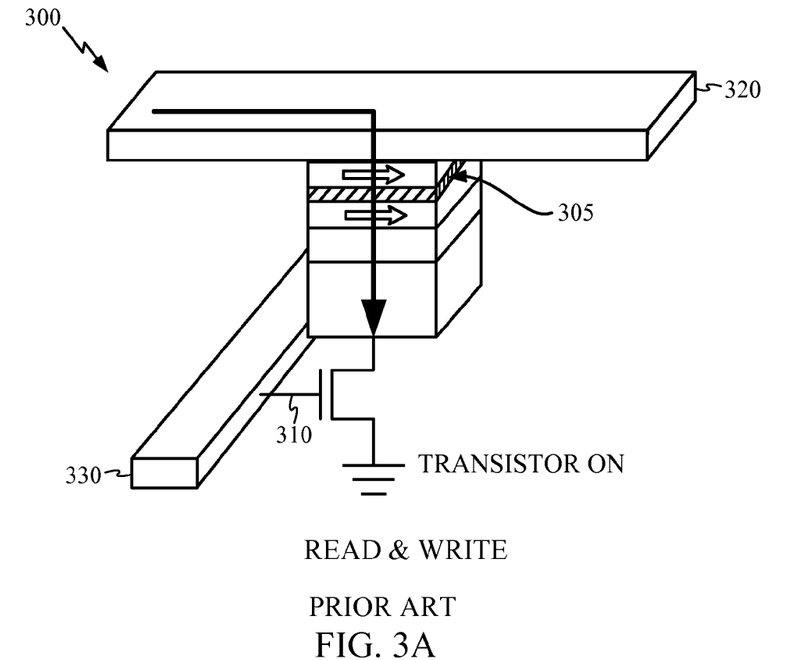
FIGS. 3A and 3B are illustrations of Spin Transfer Torque Magnetoresistive Random Access Memory (STT-MRAM) cells.

Unlike conventional MRAM, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the polarity of the free layer. The read operation is similar to conventional MRAM in that a current is used to detect the resistance/logic state of the MTJ storage element, as discussed in the foregoing. As illustrated in FIG. 3A, a STT-MRAM bit cell 300 includes MTJ 305, transistor 310, bit line 320 and word line 330. The transistor 310 is switched on for both read and write operations to allow current to flow through the MTJ 305, so that the logic state can be read or written.

Figure 3B:
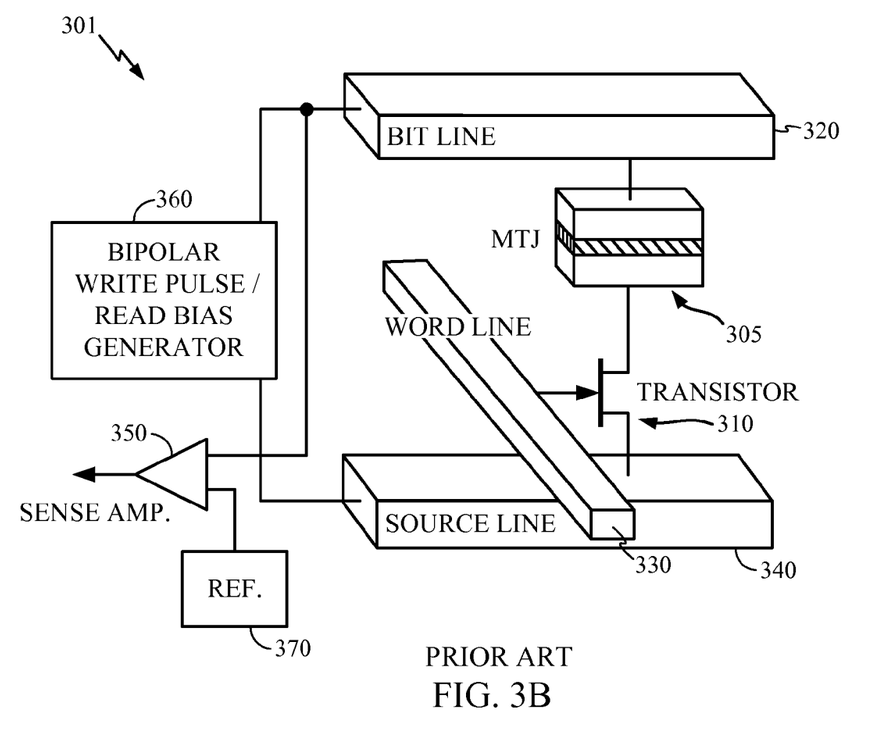

Referring to FIG. 3B, a more detailed diagram of a STT-MRAM cell 301 is illustrated, for further discussion of the read/write operations. In addition to the previously discussed elements such as MTJ 305, transistor 310, bit line 320 and word line 330, a source line 340, sense amplifier 350, read/write circuitry 360 and bit line reference 370 are illustrated. As discussed above, the write operation in an STT-MRAM is electrical. Read/write circuitry 360 generates a write voltage between the bit line 320 and the source line 340. Depending on the polarity of the voltage between bit line 320 and source line 340, the polarity of the free layer of the MTJ 305 can be changed and correspondingly the logic state can be written to the cell 301. Likewise, during a read operation, a read current is generated, which flows between the bit line 320 and source line 340 through MTJ 305. When the current is permitted to flow via transistor 310, the resistance (logic state) of the MTJ 305 can be determined based on the voltage differential between the bit line 320 and source line 340, which is compared to a reference 370 and then amplified by sense amplifier 350. Those skilled in the art will appreciate the operation and construction of the memory cell 301 is known in the art. Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

The electrical write operation of STT-MRAM eliminates the scaling problem due to the magnetic write operation in MRAM. Further, the circuit design is less complicated for STT-MRAM. However, during system power-up, there is a potential for voltage surges to occur in bit line 320 and word line 330 that may be similar to or greater in magnitude than the write threshold. Such voltage surges can have a substantial chance of disturbing the logic state of MTJ 305, and thus degrading the integrity of the memory.

SUMMARY

Exemplary embodiments of the invention are directed to systems, circuits and methods for data protection during power-up in STT-MRAM.

Accordingly, an embodiment of the invention is directed to a STT-MRAM array including a plurality of bit cells, a power-up controller, and a first plurality of precharge transistors. The plurality of bit cells are each coupled to one of a plurality of bit lines and word lines. The power-up controller is configured to provide a power-up control signal to control the voltage level of at least one of the bit lines or the word lines during power-up. The first plurality of precharge transistors are respectively coupled to at least one of the plurality of bit lines or the plurality of word lines, each precharge transistor being configured to discharge a corresponding bit line or word line to a desired voltage level based on the power-up control signal.

Another embodiment of the invention is directed to a method of protecting data during power-up of a STT-MRAM array. The method includes providing a power-up control signal during power-up to a first plurality of precharge transistors, and holding at least one of a plurality of bit lines or a plurality of word lines to a desired voltage level in response to the power-up control signal.

Another embodiment of the invention is directed to an apparatus for protecting data during power-up of a STT-MRAM array. The apparatus includes means for providing a power-up control signal during power-up to a first plurality of precharge transistors, and means for holding at least one of a plurality of bit lines or a plurality of word lines to a desired voltage level in response to the power-up control signal.

Another embodiment of the invention can include a computer-readable medium including program code stored thereon for protecting data during power-up of a Spin Transfer Torque Magnetoresistive Random Access Memory (STT-MRAM) array. The computer-readable medium comprising program code to provide a power-up control signal during power-up to a first plurality of precharge transistors; and program code to hold at least one of a plurality of bit lines or a plurality of word lines to a desired voltage level in response to the power-up control signal.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of embodiments of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of embodiments of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

As discussed in the background, STT-MRAM uses a low write threshold for each cell, which is an advantage of this memory type over MRAM. However, during system power-up, initial voltage surges in the bit line (BL) and word line (WL) voltage levels may be similar to or greater in magnitude than the write threshold, which may disturb the logic state of one or several MTJ data storage elements, and thus, degrade the integrity of the memory. To mitigate this problem, embodiments of the invention provide for holding the bit line and word line voltage levels to a lower value than the write threshold voltage during system power-up.

Conventionally, the bit line and word line voltages in STT-MRAM arrays are not directly controlled during power-up and are essentially floating. However, embodiments of the invention hold the bit line and word line voltage levels at a desired voltage during system power-up. It will be appreciated that the desired voltage may vary depending on application specific design concerns, but will typically be a relatively low or ground level voltage.

Figure 4:
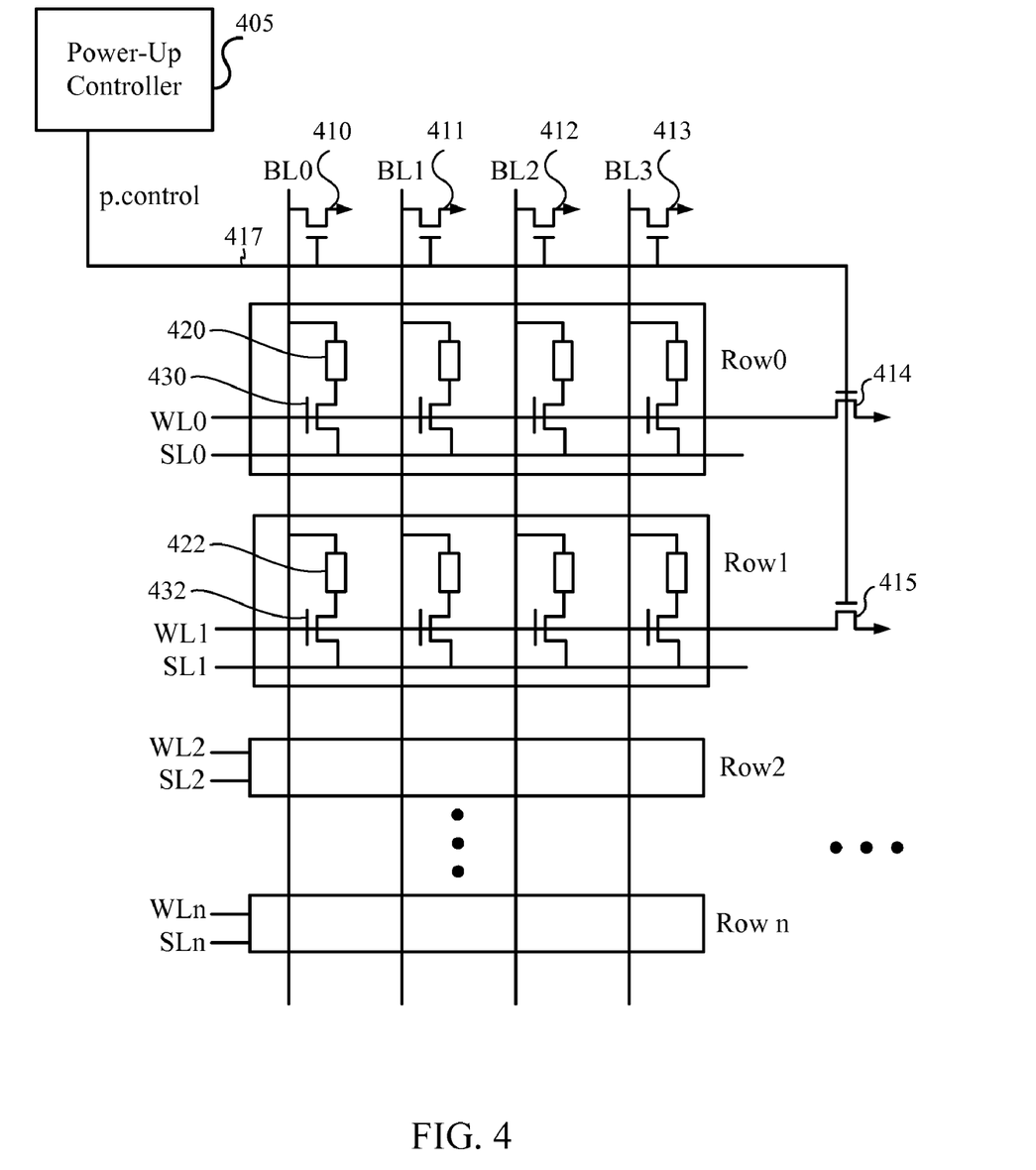
FIG. 4 is an illustration of a section of a STT-MRAM array.

FIG. 4 illustrates a section of a STT-MRAM array according to an embodiment of the invention.

As shown, STT-MRAM array 400 includes four exemplary bit lines (BL0-BL3). Each bit line is coupled to a plurality of bit cells, conventionally arranged in rows (e.g., Row 0-Row n). Each row has an associated word line (WL0-WLn) and source line (SL0-SLn). Each bit cell includes an MTJ (e.g., 420) and a word line transistor (e.g., 430), as discussed in the background (see, e.g., FIGS. 3A and 3B). Each bit cell in the array can be selectively addressed for read and write operations by activating its corresponding bit line and word line.

In addition, each bit line BL0-BL3 is coupled to a corresponding precharge transistor 410-413, and each word line WL0-WL1 is coupled to a corresponding precharge transistor 414-415. Each precharge transistor 410-415 couples its corresponding bit line or word line to a power-up control signal p.control 417 provided by a power-up controller 405. The power-up control signal 417 is activated by the power-up controller 405 during system power-up based on system power-up timing information. System power-up timing information may be provided to the power-up controller 405 by a system controller or the like (not shown), for example, which is well known in the art and will thus not be described here in detail.

Further, although illustrated as a separate element the power-up controller 405 may be integrated with other devices in the system. It will be recognized that various actions/functionalities described herein related to the power-up controller can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein.

When the power-up control signal p.control 417 is active (e.g., high), embodiments of the invention discharge the bit lines and word lines to a relatively low or ground level voltage via precharge transistors 410-415, respectively. The duration for which the power-up controller 405 activates the power-up control signal p.control 417 may be a predetermined interval or may be determined dynamically based on power-up feedback information provided by the system controller or the like. Additional details regarding the signaling will be discussed in relation to FIG. 5 below.

It will be appreciated that the foregoing circuit diagram is provided solely for purposes of illustration and the embodiments of the invention are not limited to this illustrated example. For example, the bit lines and word lines need not be discharged according to the same power-up control signal, and can be controlled by separate power-up control signals to allow for individual discharge timing as desired. Furthermore, the bit lines and word lines need not be both discharged during power-up, as merely one or the other of the bit line and word line voltage levels can be held to the desired voltage level to achieve at least some level of data protection. This may simplify circuit design for some applications, while still providing a reasonable amount of data protection. In addition, other devices can be used that achieve the same functionality as those specifically shown.

Figure 5:
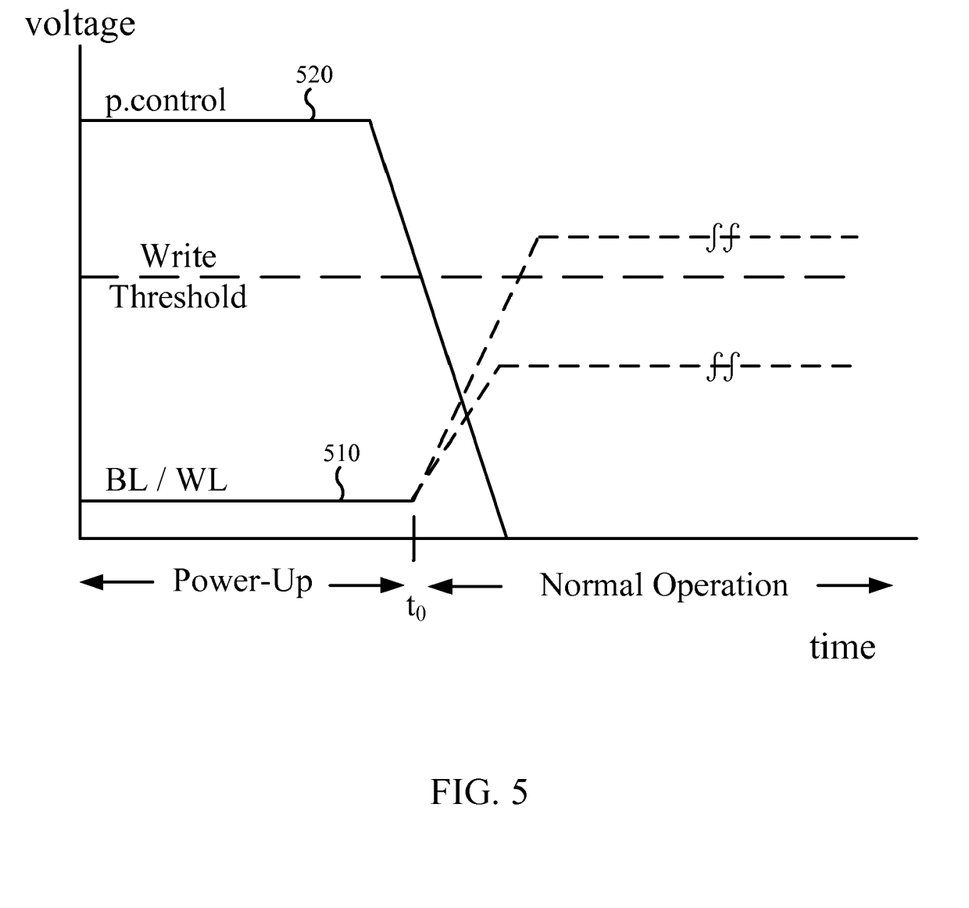
FIG. 5 is an illustration of signaling for the circuit of FIG. 4.

FIG. 5 illustrates signaling for the circuit of FIG. 4 in accordance with embodiments of the invention.

Initially, during system power-up, power-up control signal p.control 417 is activated and maintained at p.control voltage level 520, which activates the precharge transistors (see, e.g., 410 of FIG. 4). In response, the bit line and/or word line voltage levels 510 are maintained at a relatively low or ground level desired voltage level. At or near the conclusion of system power-up at time to, a normal operation mode is entered. Here, power-up control signal p.control 417 is de-activated and p.control voltage level 520 is maintained at or near a ground voltage level. Thus, the bit line and word line voltage levels 510 are allowed to be controlled in accordance with memory read operations, memory write operations, etc., providing for normal operation of the memory system after system power-up.

Although the foregoing disclosure shows illustrative embodiments of the invention, it will be appreciated that embodiments of the invention are not limited to these illustrations. For example, the specific time intervals of the signals illustrated in FIG. 5 may be modified as long as the functionality is maintained (e.g., bit line and/or word line voltage levels are maintained substantially below the write threshold to prevent invalid write operations). Further, embodiments of the invention can include methods for performing the functions, steps, sequence of actions and/or algorithms discussed herein.

Figure 6:
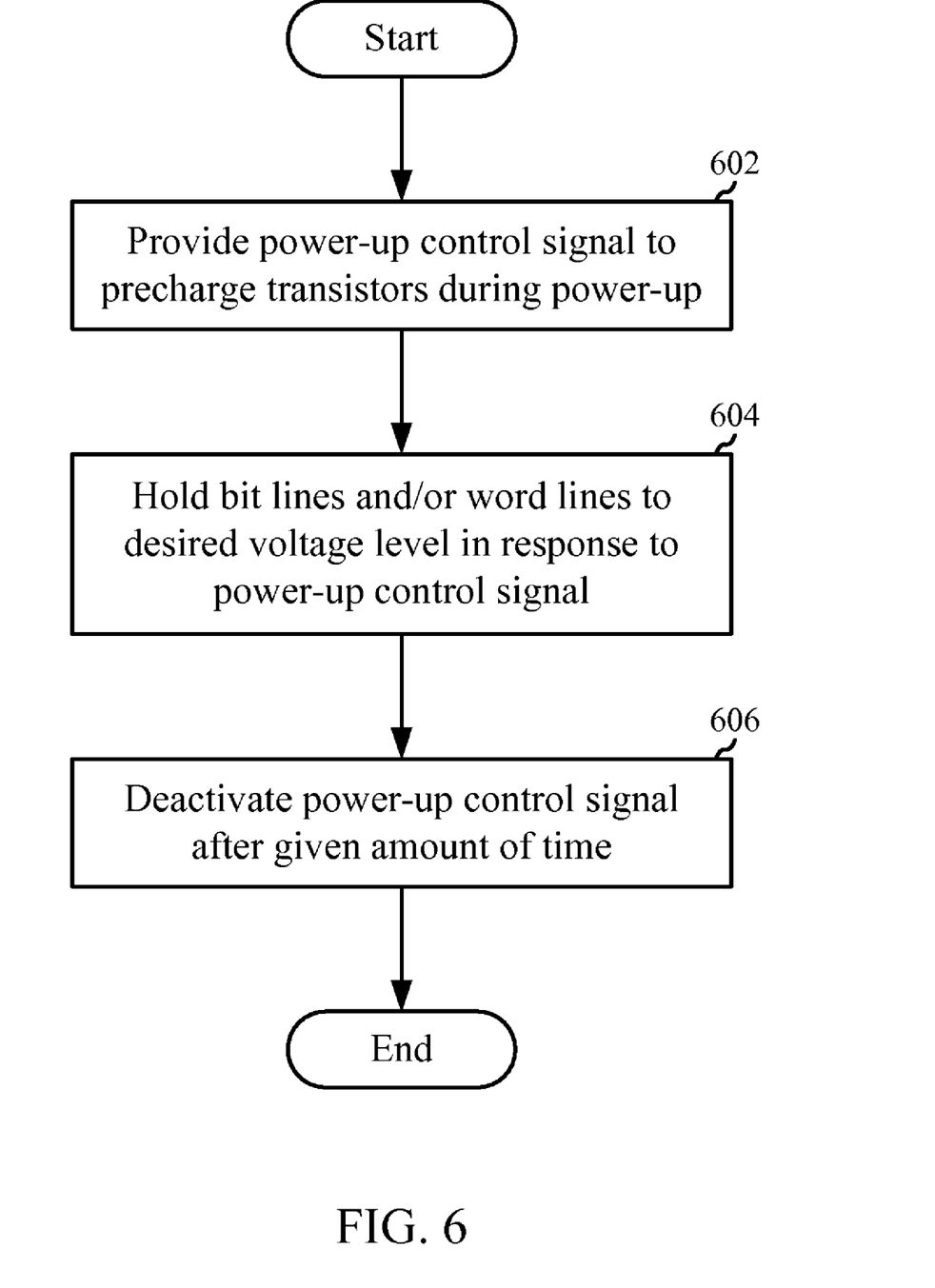
FIG. 6 is a flowchart illustrating a method for protecting data during power-up of a STT-MRAM array.

For example, FIG. 6 is a flowchart illustrating a method for protecting data during power-up of a STT-MRAM array according to an embodiment of the invention. As shown, the method can include providing the power-up control signal to the precharge transistors during power-up (block 602), holding the bit lines and/or word lines to the desired voltage level in response to the power-up control signal (block 604), and deactivating the power-up control signal after a given amount of time (block 606). Additional methods and aspects of embodiments of the invention will be recognized from the sequence of actions/functions disclosed herein and it will be appreciated that embodiments of the invention are not limited to the flowchart illustrated in FIG. 6.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Accordingly, an embodiment of the invention can include a computer-readable medium including program code stored thereon for protecting data during power-up of a Spin Transfer Torque Magnetoresistive Random Access Memory (STT-MRAM) array. The computer-readable medium can include program code to provide a power-up control signal during power-up to a first plurality of precharge transistors; and program code to hold at least one of a plurality of bit lines or a plurality of word lines to a desired voltage level in response to the power-up control signal. As noted above, the program code may reside in any medium including embedded storage. When the program code is accessed and executed by a machine (e.g., processor, controller, state machine, etc.), it causes the machine to perform operations defined in the program code. The operations may be performed solely by the machine or may be performed in cooperation with other elements in the system operably coupled to the machine.

While the foregoing disclosure shows illustrative embodiments of the invention, it should be noted that various changes and modifications could be made herein without departing from the scope of embodiments of the invention as defined by the appended claims. For example, specific logic signals corresponding to the transistors/circuits to be activated, may be changed as appropriate to achieve the disclosed functionality as the transistors/circuits may be modified to complementary devices (e.g., interchanging PMOS and NMOS devices). Likewise, the functions, steps and/or actions of the methods in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A Spin Transfer Torque Magnetoresistive Random Access Memory (STT-MRAM) array comprising:
    a plurality of bit cells, each coupled to a plurality of word lines;
    a power-up controller configured to provide a power-up control signal to control a voltage level of at least one of the word lines during power-up;
    a first plurality of precharge transistors respectively coupled to at least one of the plurality of word lines, each precharge transistor being configured to discharge a corresponding word line to a desired voltage level based on the power-up control signal.

2. The STT-MRAM array of claim 1, wherein the desired voltage level is less than a write threshold of the bit cells and greater than a ground voltage level.

3. The STT-MRAM array of claim 1, wherein the desired voltage level is a ground voltage level.

4. The STT-MRAM array of claim 1, wherein the power-up control signal is coupled to the gate of each precharge transistor.

5. The STT-MRAM array of claim 1, further comprising:
    a second plurality of precharge transistors coupled to at least one of a plurality of bit lines, each being configured to discharge a corresponding bit line to a second desired voltage level based on the power-up control signal.

6. The STT-MRAM array of claim 5, wherein the second desired. voltage level is less than a write threshold of the bit cells and greater than a ground voltage level.

7. The STT-MRAM array of claim 5, wherein the second desired voltage level is a ground voltage level.

8. The STT-MRAM array of claim 5, wherein the power-up control signal s coupled to the gate of each precharge transistor.

9. The STT-MRAM array of claim 1, wherein each bit cell comprises:
    a storage element; and
    a word line transistor coupled to the storage element, 10. The STT-MRAM array of claim 9, wherein the storage element is a magnetic tunnel junction (WTJ) and wherein the word line transistor is coupled in series with the MTJ.

11. The STT-MRAM array of claim 1, wherein the power-up controller is configured to provide the power-up control signal for an amount of time based on power-up information received from a system controller.

12. The STT-MRAM array of claim 1, wherein the power-up controller is configured to provide the power-up control signal for a predetermined amount of time.

13. A method of protecting data during power-up of a Spin Transfer Torque Magnetoresistive Random Access Memory (STT-MRAM) array, comprising:
    providing a power-up control signal during power-up to a first plurality of precharge transistors; and
    holding at least one of a plurality of word lines to a desired voltage level in response to the power-up control signal.

14. The method of claim 13, further comprising:
    holding at least one of a. plurality of bit lines to a second desired voltage level in response to the power-up control signal.

15. The method of claim 13, wherein the desired voltage level is less than a write threshold of the bit cells and greater than a ground voltage level.

16. The method of claim 13, wherein the desired voltage level is a ground voltage 17. The method of claim 13, further comprising:
    receiving power-up information from a system controller; and
    deactivating the power-up control signal after an amount of time based on the received power-up information.

18. The method of claim 13, further comprising:
    deactivating the power-up control signal after a predetermined amount of time, 19. An apparatus for protecting data during power-up of a Spin Transfer Torque Magnetoresistive Random Access Memory (STT-MRAM) array, comprising:
    means for providing a power-up control signal during power-up to a first plurality of precharge transistors; and
    means for holding at least one of a plurality of word lines to a desired voltage level in response to the power-up control signal.

20. The apparatus of claim 19, further comprising:
    means for holding at least one of a. plurality of bit lines to a second desired voltage level in response to the power-up control signal.

21. The apparatus of claim 19, wherein the desired voltage level is less than a write threshold of the bit cells and greater than a ground voltage level.

22. The apparatus Of claim 19, wherein the desired voltage level is a ground voltage level.

23. The apparatus of claim 19, further comprising:
    means for receiving power-up information from a system controller; and
    means for deactivating the power-up control signal after an amount of time based on the received power-up information.

24. The apparatus of claim 19, further comprising:
    means for deactivating the power-up control signal after a predetermined amount of time, 25. A computer-readable medium including program code stored thereon for protecting data during power-up of a Spin Transfer Torque Magnetoresistive Random Access Memory (STT-MRAM) array, comprising:
    program code to provide a. power-up control signal during power-up to a first plurality of precharge transistors; and
    program code to hold at least one of a plurality of word lines to a desired voltage level in response to the power-up control signal.

26. The computer-readable medium of claim 25, further comprising:
    program code to hold at least one of a plurality of bit lines to a second desired voltage level in response to the power-up control signal.

27. A Spin Transfer Torque Magnetoresistive Random Access Memory (STT-MRAM) array comprising:
    a plurality of bit cells, each coupled to a plurality of word lines;

a power-up controller configured to provide a power-up control signal to control a voltage level of the plurality of word lines and plurality of bit lines during power-up;

a plurality of precharge transistors respectively coupled to each of the plurality of word lines and the plurality of bit lines, each precharge transistor being configured to discharge a corresponding word line or bit line to a desired voltage level based on the power-up control signal, wherein the desired voltage level is less than a write threshold of the bit cells and greater than a ground voltage level.

* * * * *